United States Patent
Pasqualino et al.

(10) Patent No.: US 7,356,051 B2
(45) Date of Patent: Apr. 8, 2008

(54) DIGITAL VISUAL INTERFACE WITH AUDIO AND AUXILIARY DATA CROSS REFERENCE TO RELATED APPLICATIONS

(75) Inventors: Christopher Pasqualino, Glendora, CA (US); Jeffrey S. Bauch, Torrence, CA (US); Stephen Petilli, Pasadena, CA (US)

(73) Assignee: Broadcom Corporation, Irvine, CA (US)

( * ) Notice: Subject to any disclaimer, the term of this patent is extended or adjusted under 35 U.S.C. 154(b) by 1177 days.

(21) Appl. No.: 09/951,671

(22) Filed: Sep. 12, 2001

(65) Prior Publication Data
US 2002/0136241 A1 Sep. 26, 2002

Related U.S. Application Data

(60) Provisional application No. 60/263,792, filed on Jan. 24, 2001, provisional application No. 60/268,840, filed on Feb. 14, 2001, provisional application No. 60/274,433, filed on Mar. 9, 2001.

(51) Int. Cl.
*H04J 1/00* (2006.01)
(52) U.S. Cl. ........................ 370/490; 370/509
(58) Field of Classification Search ................ 370/490, 370/493–495, 509
See application file for complete search history.

(56) References Cited

U.S. PATENT DOCUMENTS

| | | | | |
|---|---|---|---|---|
| 4,392,159 A | * | 7/1983 | Lemoine et al. ............... | 386/12 |
| 5,504,815 A | * | 4/1996 | Ryan et al. .................. | 380/213 |
| 5,835,498 A | | 11/1998 | Kim et al. | |
| 6,151,334 A | | 11/2000 | Kim et al. | |
| 6,697,569 B1 | * | 2/2004 | Gomez et al. .............. | 386/120 |
| 6,754,241 B1 | * | 6/2004 | Krishnamurthy et al. ... | 370/537 |
| 6,757,300 B1 | * | 6/2004 | Pages et al. ................. | 370/493 |
| 6,886,030 B1 | * | 4/2005 | Easterbrook et al. ....... | 709/206 |

(Continued)

FOREIGN PATENT DOCUMENTS

WO WO 00/14626 3/2000

OTHER PUBLICATIONS

"Integrating Digital Audio into the serial digital video signal" by David K. Fibush.*

(Continued)

*Primary Examiner*—Joseph Feild
*Assistant Examiner*—Inder Pal Mehra
(74) *Attorney, Agent, or Firm*—McAndrews Held & Malloy, Ltd.

(57) ABSTRACT

One embodiment of the present invention uses an abbreviated blanking period, in comparison to the standard VESA and CEA-EIA blanking periods, in order to send data, including low bandwidth, non-timing information, over one or more channels of the digital video link. By shortening the blanking period, the amount of time available for sending data in each scan line is increased, enabling the system to send more data over each channel. The inactive video portion of a scan line sent during vertical sync may also be used to send additional digital data. Shortening the blanking periods and/or using the inactive video sections of the horizontal scan lines adds to the overall data capacity of the link and may be used to send other digital data, such as multi-channel audio, video, control, timing, closed captioning or other digital data.

21 Claims, 16 Drawing Sheets

U.S. PATENT DOCUMENTS

2002/0097869 A1* 7/2002 Pasqualino et al. ......... 380/200
2007/0201492 A1* 8/2007 Kobayashi ............. 370/395.64

OTHER PUBLICATIONS

"Multiplexing and Demultiplexing Digital Audio and video in today's digital environment" by Keith Y. Reynolds and Joe Rainbolt.*

"Silicon Image First to Couple Digital Audio and Video on the DVI Link," Press Releases, 'online', Jan. 16, 2001, XP 002202474.

Fibush, David K., "Integrating Digital Audio into the Serial Digital Video Signal," SMPTE Journal, SMPTE Inc. Scarsdale, NY, vol. 103, No. 9, Sep. 1, 1994, pp. 574-579.

Reynolds, Keith Y. et al.; "Multiplexing and Demultiplexing Digital Audio and Video in Today's Digital Environment," SMPTE Journal, SMPTE In. Scarsdale, NY, vol. 102, No. 10, Oct. 1, 1993, pp. 905-909.

* cited by examiner

DIGITAL VISUAL INTERFACE WITH AUDIO AND AUXILIARY DATA CROSS REFERENCE TO RELATED APPLICATIONS

CROSS REFERENCE TO RELATED APPLICATIONS

This application is related to, and claims benefit of and priority from Provisional Application No. 60/263,792 filed Jan. 24, 2001, Provisional Application No. 60/268,840 filed Feb. 14, 2001, and Provisional Application No. 60/274,433 filed Mar. 9, 2001, the complete subject matter of each of which is hereby incorporated herein by reference in its entirety.

FEDERALLY SPONSORED RESEARCH OR DEVELOPMENT

[Not Applicable]

BACKGROUND OF THE INVENTION

One embodiment of the present invention relates to increasing the amount of digital data capacity or throughput of a digital video link.

Typically digital video signals have a minimum of sixty frames of video per second. Each video frame is composed of horizontal scan lines, where the number of horizontal scan lines in a frame is dependent on the resolution of the system. Each horizontal scan line includes a blanking period followed by a series of digital video pixels. More specifically, the horizontal blanking period is used to send timing information. This consists of an HSync, comprised of a Front Porch, a Synchronization Pulse and a Back Porch. There is also typically a vsync (vertical sync) blanking period that is comprised of a Front Porch, a Synchronization Pulse and a Back Porch. The horizontal and vertical sync blanking periods take up to 30 to 40% of the total bandwidth is taken up by sync data.

Commercial applications utilizing Digital Visual Interface (hereinafter referred to as "DVI") standard frequently make significant use of existing VESA Computer Display standards. The sequence of timing and video data for particular display resolutions and timing is specified in the VESA Computer Display Monitor Timing standard, Version 1.0, Revision 0.8 dated Sep. 17, 1998, incorporated herein by reference (hereinafter referred to as "DVI 1.0 specification"). A recent digital television standard is the CEA-EIA 861 standard for high-speed digital interfaces, also incorporated herein by reference.

The DVI 1.0 specification identifies a high-speed digital connection, interface or link for visual data types that are display technology independent. In one example, the interface provides a connection between a computer and its display device. In another example, the interface provides a connection between a set top box and a DTV or HDTV. Such a DVI interface enables content to remain in the lossless digital domain from creation to consumption; display technology independence; plug and play through hot plug detection, EDID and DDC2B; and digital and analog support in a single connector.

One problem with commercial applications utilizing the DVI standard is that they do not provide for any transmission of digital audio data, let alone provide for the use of multiple audio channels or multiple audio streams. Another problem with such applications is that they do not provide for transmission of auxiliary digital data.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Aspects of the present invention may be found in a processing system for increasing the digital data capacity of a digital video communications link. In one embodiment the system comprises one or more assembly devices, such as, for example, a FIFO circuit, that assembles one or more digital data streams into a single digital data stream. The single digital data stream may be digital audio, for example. The system also comprises a multiplexer that is adapted to multiplex the single digital data stream with a line of video data to form an aggregate digital data stream. The aggregate digital data stream may be compatible with a predetermined video timing standard, for example. The system further comprises one or more transmitters that transmits the aggregate digital data stream and low bandwidth information. The low bandwidth information is transmitted during blanking periods associated with said aggregate digital data stream.

In one embodiment, the transmitter(s) redundantly transmit the low bandwidth information. The low bandwidth information may comprise, for example, non-timing information. In the case where the single digital data stream is digital audio data, the low bandwidth information may be audio length information, for example.

In another embodiment the system further comprises a receiver and a de-multiplexor. The receiver receives the aggregate digital data stream and the low bandwidth information, and the de-multiplexor splits out the digital data from the video data. This may be accomplished using the low bandwidth information.

Yet another embodiment of the present invention provides a method for increasing the digital data capacity of a digital video communications link. The method comprises the steps of decreasing the duration of a blanking interval associated with a line of video data that is less than industry standard blanking intervals, combining a digital data stream with a line of video data, and transmitting the digital data stream and low bandwidth information. The digital data stream may comprise, for example, an audio data stream, and the low bandwidth information may comprise, for example, audio length information or other non-timing information. The transmission of the digital data stream and the low bandwidth information may occur using bandwidth freed by the decrease in the duration of the blanking interval. In one embodiment, the low bandwidth information is redundantly transmitted.

Still another embodiment of the present invention provides a method for increasing the digital data capacity of a digital video communications link, which comprises receiving information transmitted at a first timing standard, collecting sync timing information for the received information, and modifying the collected sync timing information. The modified sync timing information is then transmitted with aggregate information and low bandwidth information. Next, the sync timing information, the aggregate information and the low bandwidth information are received. Audio is then generated from the received aggregate information using at least the low bandwidth information. The audio is output as an audio stream, the first timing standard is reconstructed, and video is also output.

In one embodiment, the method may further comprise decreasing the duration of a blanking interval associated with the first timing standard. The low bandwidth may be redundantly transmitted, and may comprise audio length information or other non-timing, for example.

Additional features of the present invention, as well as details of an illustrated embodiment thereof, will be more fully understood from the following description and drawings, wherein like numerals refer to like parts.

DETAILED DESCRIPTION OF THE INVENTION

The present invention provides a system and method for incorporating additional digital channels over a DVI link. In one embodiment, multiple audio streams are transmitted over the DVI link. This includes the transmission of high quality, multi-channel audio over the DVI link, meeting the needs of the Consumer Electronics (hereinafter referred to as "CE") industry. It should be appreciated that the system and method provides for the transmission of other data channels over the link as well.

Figure 1:
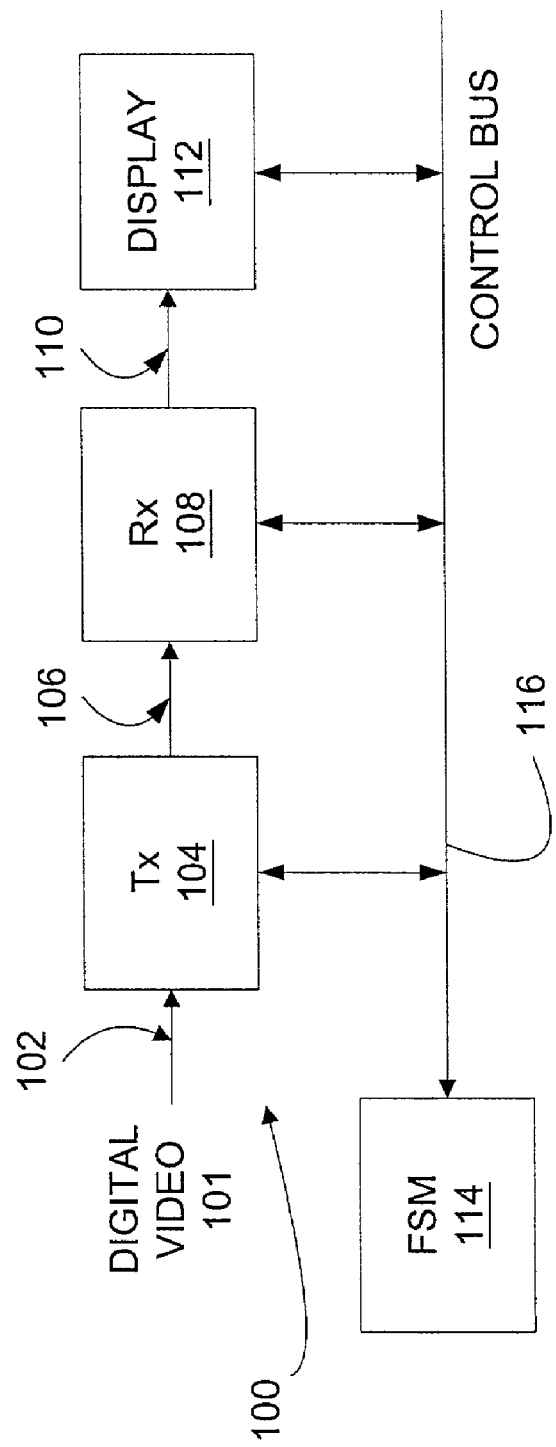
FIG. 1 illustrates a block diagram of an exemplary digital display link system.

FIG. 1 illustrates a block diagram of an exemplary digital display link system, generally designated 100. In this embodiment, system 100 includes a digital video source 101 connected to a digital video transmitter 104 via input lines 102. Transmitter 104 encodes the digital video data for transmission over a digital display link 106. On the display side of the system, receiver 108 decodes the digital signal received from digital display link 106 and produces a digital video signal transmitted via output lines 110 to display 112. The overall operation of the system may be controlled, for example, by finite state machine 114 using control bus 116.

Figure 2:
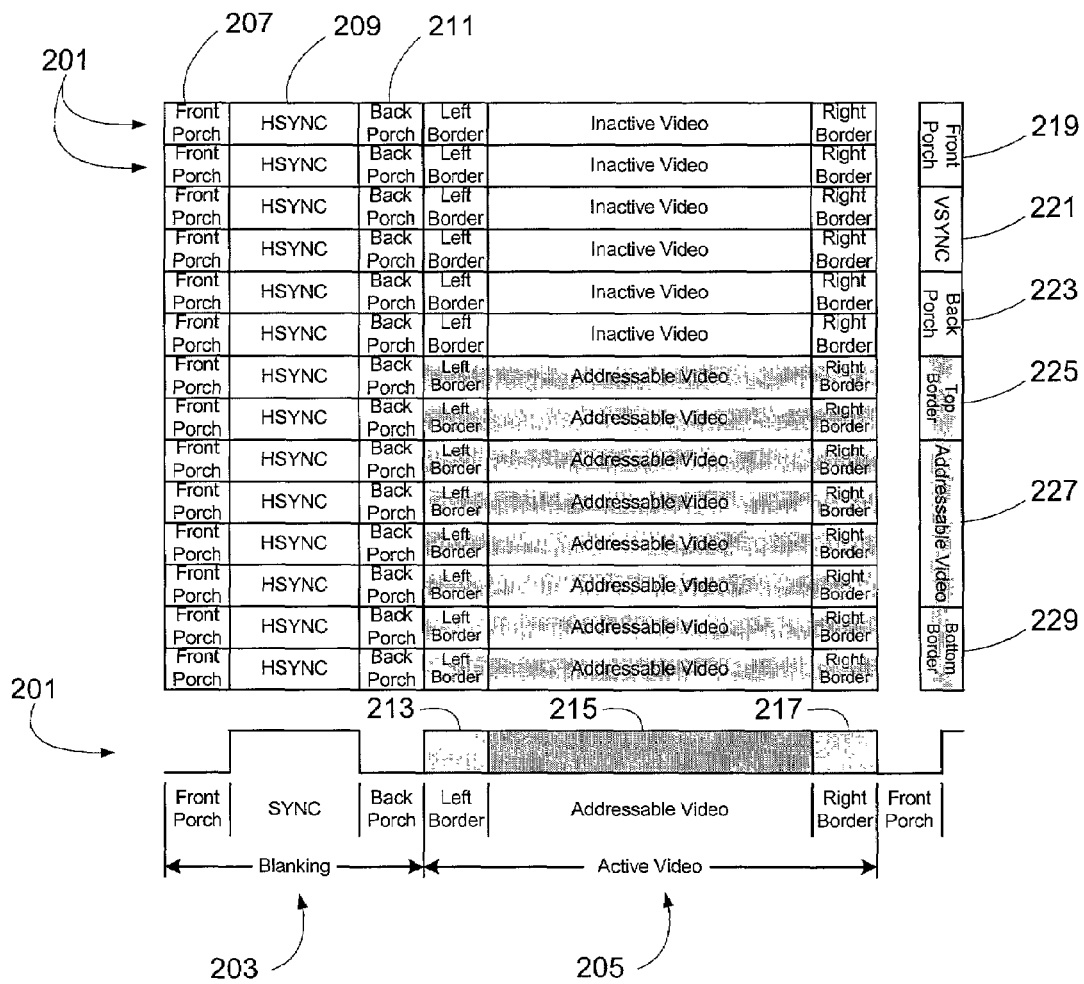
FIG. 2 is a stylized example of a digital video frame that illustrates timing information.

Generally, the typical digital video signal includes sixty frames of video per second. Of course, the frame rate can be much lower or higher than 60. For example, the range can be from 25 to 120 frames per second. A video frame is built up from or comprised of horizontal scan lines, where the number of horizontal lines in a frame is dependent on the resolution of the system. FIG. 2 illustrates a timing diagram of an abbreviated standard frame of digital video data, which, for example, may be transmitted via system 100 illustrated in FIG. 1.

FIG. 2 is a stylized example of a digital video frame that illustrates timing information. Each horizontal scan line 201 includes a blanking period or sync 203 followed by a series of digital video pixels 205. The horizontal blanking period or sync is used to send timing information and is comprised of three elements: a Front Porch 207, an HSYNC or synchronization pulse 209 and a back porch 211. It should be appreciated that the sync pulse 208 can be either positive or negative.

Active video 205 is also comprised of three elements: a left border 213, addressable video 215, and a right border 217. The length of the left border 213 and the right border 217 is often 0.

Various elements of a vertical frame are also illustrated is FIG. 2. Specifically, the vertical frame is comprised of a front porch 219, a vertical sync or VSYNC 221, a back porch 223, a top border 225, addressable video 227, and a bottom border 229. Like HSYNC, VSYNC can be either positive or negative.

Frames are stacked vertically, so that the entire video stream is a continuum of vertically stacked lines. All lines are then transmitted, in a serial fashion, left to right and top to bottom.

The sequence of video timing and video data is specified in the VESA and CEA-EIA standards referenced above. The VESA Computer Display standard is used by digital video links such as DVI links. An exemplary DVI link has three serial channels for RGB video data and a clock channel.

Figure 3:
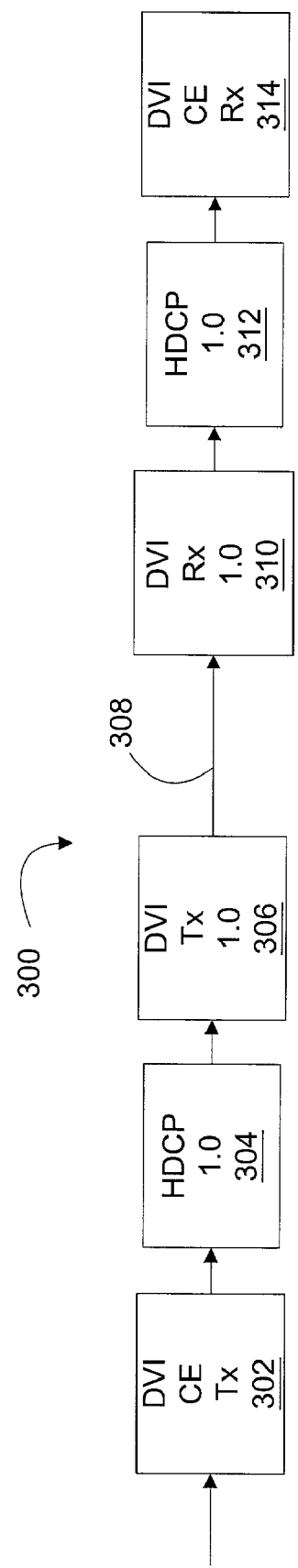
FIG. 3 illustrates a block diagram of a digital display link system with increased digital data capacity in accordance with one embodiment of the present invention.

A block diagram of one embodiment of a digital display link system with increased digital data capacity, generally designated 300, is illustrated in FIG. 3. In this embodiment, the system 300 increases the digital data capacity of a digital video communications link wherein the data on the link is encrypted according to the HDCP standard.

In this embodiment, system 300 includes a DVI CE transmitter 302 that transmits information at a first timing standard to a HDCP engine or device 304. In this embodiment, all inputs to the system 300 may be compliant with the requirements of the DVI 1.0 specification. The system 300 accepts a single stream of video data, one or more streams of audio data (e.g., from 0 to 8 streams), and one or more streams of auxiliary data (e.g., from 0 to 4 streams). In one embodiment, the audio rate for all active audio channels is identical as inputs. Similarly, the auxiliary data rate for all active auxiliary channels may be identical. It should be appreciated that the auxiliary rates and audio rates need not be the same. Furthermore, auxiliary channels, as well as audio channels, can each have different rates.

It should be appreciated that the audio input formats may be any digital audio format. The current embodiment specifies unformatted audio data, SPDIF, or DVD audio. It is anticipated that other audio formats will be developed, and are contemplated by the present invention. For any input standard that encodes a clock onto the data (i.e. SPDIF uses bi-phase mark encoding for much of the transmitted data), an audio input interface layer is utilized to remove the clock component to conserve link bandwidth. This encoding is re-applied by the receiver to reproduce the data format provided to the transmitter system.

The HDCP engine 304 encrypts or transforms the information according to an HDCP standard 1.0. In one embodiment, the HDCP engine 304 receives the transmitted information and encrypts it. In another embodiment, the HDCP engine 304 can be omitted. A DVI transmitter 306 communicates with the HDCP engine 304. The DVI transmitter 306 transmits the video, audio and auxiliary data stream (with optional encryption) to the DVI receiver 310 via a digital video communications or DVI link 308. While the HDCP engine 304 and DVI transmitter 306 are illustrated as separate devices, it should be appreciated that a DVI transmitter with an integrated HDCP encryption engine is also contemplated.

The DVI receiver 310 communicates the aggregate information, with the modified sync timing, to a HDCP decryption engine or device 312, where the information is decrypted or reformed (i.e., transformed) according to an HDCP 1.0 standard. In one embodiment, the multiplexed unencrypted data is communicated to a DVI CE receiver 314, where it is demultiplexed and output as independent video, audio and auxiliary data streams. The timing input to the CE transmitter 302 is reproduced, and the video stream is also output. While the HDCP decryption engine 312 and DVI receiver 314 are illustrated as separate devices, it should be appreciated that a DVI receiver with an integrated HDCP encryption engine is also contemplated.

Figure 4A:
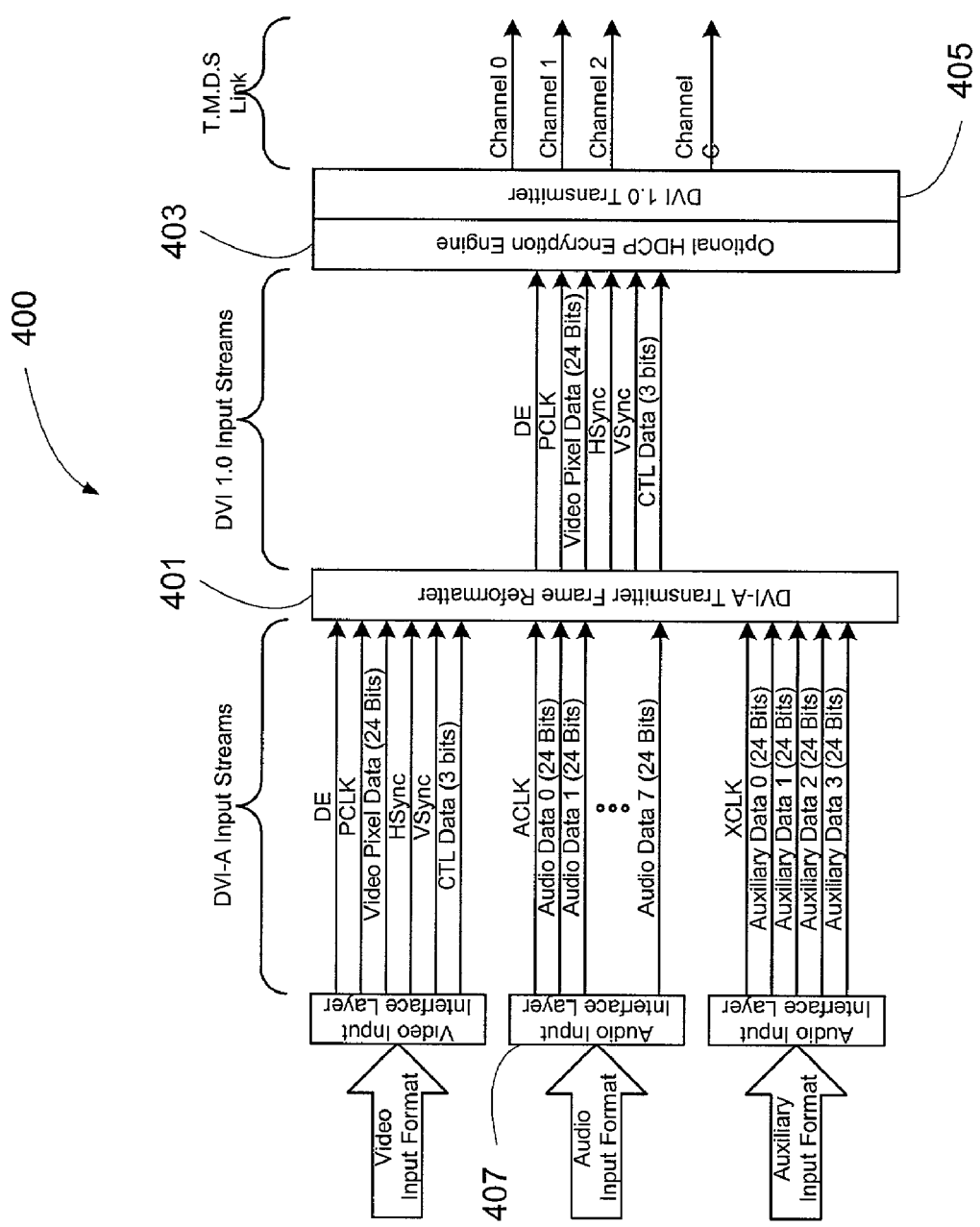
FIG. 4A depicts a transmitter system architecture for increasing digital data capacity in accordance with one embodiment of the present invention.

FIG. 4A depicts a transmitter system architecture for increasing digital data capacity in accordance with one embodiment of the present invention. Transmitter system 400 is a more detailed depiction, for example, of the left side of FIG. 3 (i.e., of the DVI CE transmitter 302, the HDCP engine 304, and the DVI transmitter 306).

Transmitter system 400 comprises a DVI transmitter frame reformatter 401 (corresponding to the DVI CE transmitter 302 of FIG. 3), an optional HDCP encryption engine 403 (corresponding to HDCP engine 304 of FIG. 3) and a DVI 1.0 Transmitter 405 (corresponding to DVI transmitter 306 of FIG. 3). The transmitter system 400 receives separate inputs of video as well as audio and/or auxiliary data, and formats the data in such a way that all inputs to the DVI transmitter 405 are compliant with the requirements of the DVI 1.0 specification (which does not support separate inputs of audio or auxiliary data). The addition of audio and/or auxiliary data is achieved without changing the overall pixel clock rate of the DVI 1.0 standard (or other current standard).

Specifically, the transmitter system 400 receives as inputs a single stream of video data over a video channel, from 0 to 8 streams, for example, of audio data over one or more audio channels, and from 0 to 4 streams, for example, of auxiliary data over one or more auxiliary channels. The standard video frame (i.e., video timing standard) that serves as an input to the transmitter system 400 may be any current standard compatible with currently available displays. As discussed above, one representation of a standard video frame is diagrammed in FIG. 2. The names for various parameters used in FIG. 2 are intended to be the same as used by the VESA timing standards. FIG. 2 is organized such that the HSYNC signal occurs on the left side of the diagram and the VSYNC signal occurs at the top. This is done to support HDCP encryption.

Referring again to FIG. 4A, the audio input to the transmitter system 400, i.e., data transmitted over the audio channel(s), may be, as mentioned above, unformatted audio data, SPDIF, or DVD audio, for example. Again, it is anticipated that other audio formats will be developed, and are contemplated by the present invention. Also as mentioned above, for any input standard that encodes a clock onto the data (e.g., SPDIF uses bi-phase mark encoding for much of the transmitted data), the audio input interface layer 407 may remove the clock component to conserve link bandwidth. This encoding is then re-applied by the receiver (FIG. 4B).

Finally, auxiliary data input to the transmitter system 400, i.e., data transmitted over the auxiliary channel(s), may be, for example, closed captioning data, or other data that provides information to a user.

The DVI transmitter frame re-formatter 401 accepts as inputs, the video channel, the audio channel(s) and the auxiliary channel(s), and combines the data into an aggregate data or frame analogous to a current video timing standard (e.g., analogous to DVI 1.0). This aggregate frame is then output to the DVI transmitter 405, which communicates it, typically over a digital video communications link.

Figure 4B:
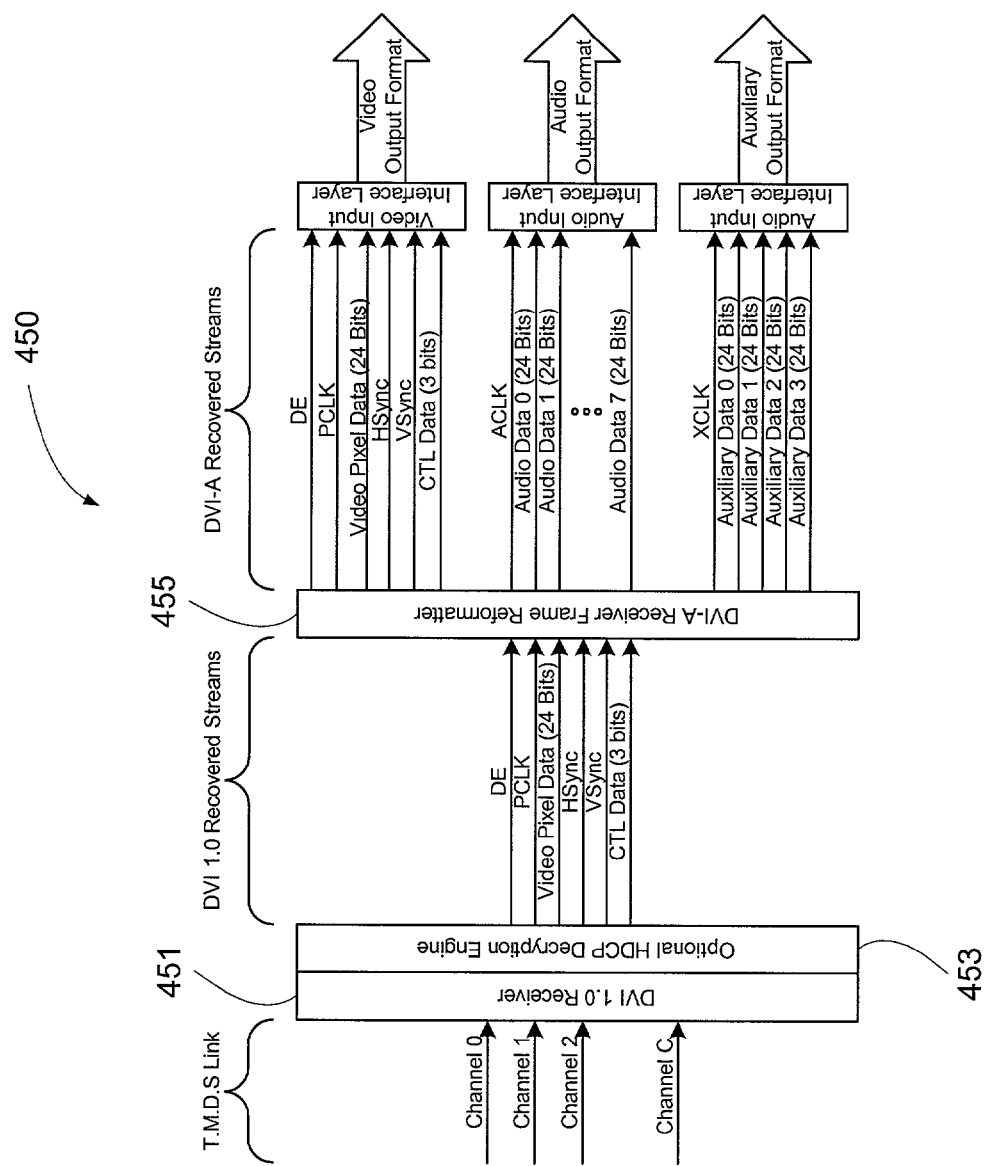
FIG. 4B depicts a receiver system architecture for increasing digital data capacity in accordance with one embodiment of the present invention.

The communicated aggregate frame is then received by a receiver system such as shown in FIG. 4B. Receiver system 450 is a more detailed depiction, for example, of the right side of FIG. 3 (i.e., of the DVI receiver 310, the HDCP decryption engine 312, and the DVI CE receiver 314).

DVI receiver 451 receives the aggregate information and communicates it, with the modified sync timing, to an HDCP decryption engine 453, where the information is decrypted or reformed (i.e., transformed) according to the HDCP 1.0 standard. In one embodiment, the multiplexed unencrypted data is communicated to a receiver frame reformatter 455, which splits out the auxiliary, audio and video data and outputs independent video, audio and auxiliary data streams. The timing input to the transmitter frame reformatter 401 of FIG. 4A is also reproduced by the receiver frame reformatter 455.

In an exemplary operation of the systems 400 and 450 of FIGS. 4A and 4B, a standard video frame (such as shown in FIG. 2, for example) is reformatted in transmitter system 400 to create a modified frame that includes audio and/or auxiliary data in addition to video data. The modified frame is then communicated to receiver system 450, which splits out the audio and/or auxiliary data, replicates the original standard video frame input to the transmitter 400, and outputs the audio and/or auxiliary data along with the video data.

Figure 5:
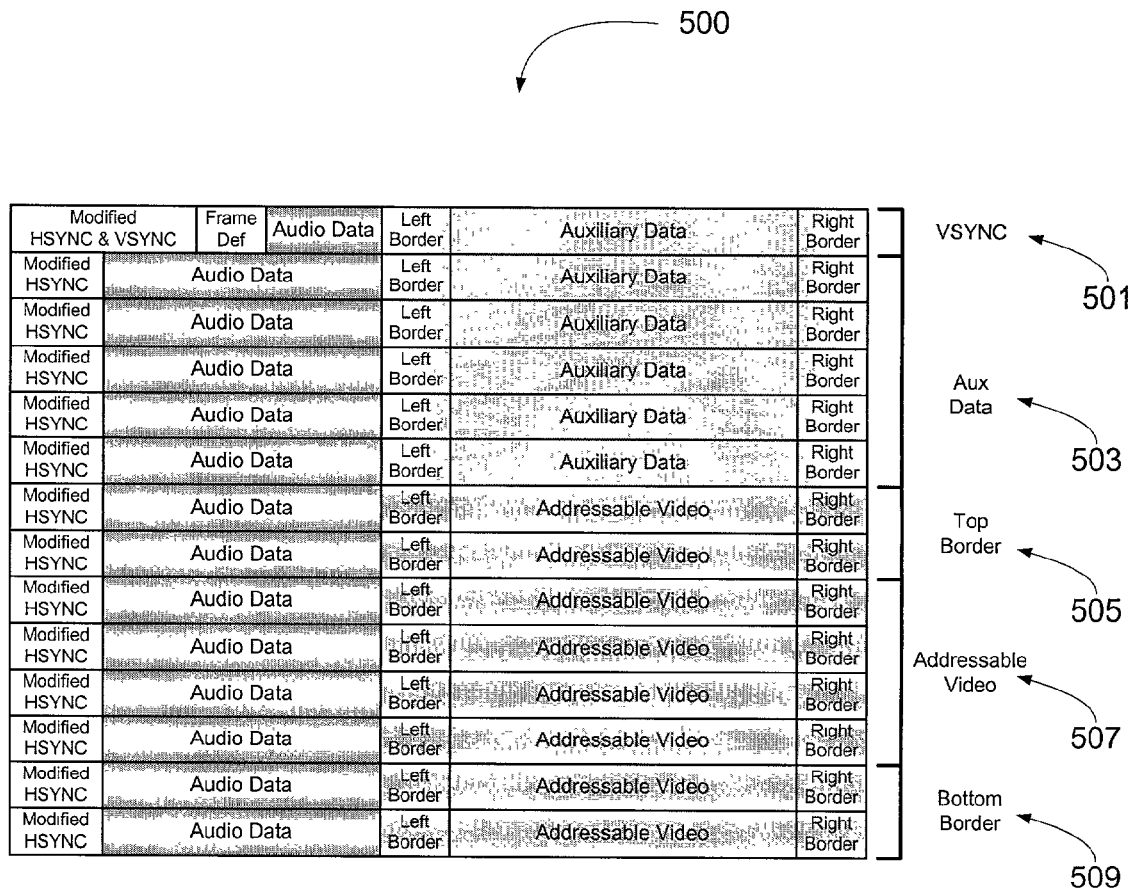
FIG. 5 represents a modified or reformatted frame definition generated by the DVI transmitter frame re-formatter of FIG. 4.

An example of such a modified frame is shown in FIG. 5. More specifically, FIG. 5 represents a modified or reformatted frame definition generated by the DVI transmitter frame re-formatter 401 of FIG. 4. By comparison to FIG. 2, for example, the blanking periods of FIG. 5 have been reduced, and the bandwidth freed has been used to transmit audio and auxiliary data.

In the frame format 500 of FIG. 5, the VSYNC front porch, sync pulse, and back porch (of FIG. 2, for example) are redefined into a VSYNC line 501 and Aux Data lines 503. The VSYNC of FIG. 5 now occurs on the first line and is reduced in duration to a single line.

In addition, the active video lines (i.e., top border 505, addressable video 507 and bottom border 509) now contain both audio and video data, as shown in FIG. 5. For these lines, an audio definition field (transmitted during the blanking period) describes an amount of audio data carried in the audio portion of the line. The amount of video data carried by these lines is defined in the VSYNC line.

In one embodiment of a modified frame, the amount of auxiliary and audio data carried on each line is variable. The amount of video data, however, is not variable for a given resolution. Also, for a given output display format, the number of lines transmitted over the DVI link is identical to the number of lines in the output Addressable Video. Furthermore, the number of addressable video pixels transmitted on each line is identical to the number of addressable pixels output from the DVI receiver.

In one embodiment of the present invention, all lines transmitted are preceded with a blanking period. This blanking period consists of 5 elements: an 8-pixel clock front porch, an 8-Pixel sync pulse, an 8-pixel clock back porch, a 32-pixel clock audio length descriptor and a descriptor back porch. For the first line in the frame, the descriptor back porch is 72 pixel clocks long. This satisfies the minimum blanking requirements for DVI 1.0. For all other lines in the frame, the descriptor back porch may be one of 8, 16, 24, 32, 40, 48, 56, 64, or 72 pixel clock cycles in duration, resulting in a blanking period that ranges from 64 to 128 clocks long.

Figure 8:
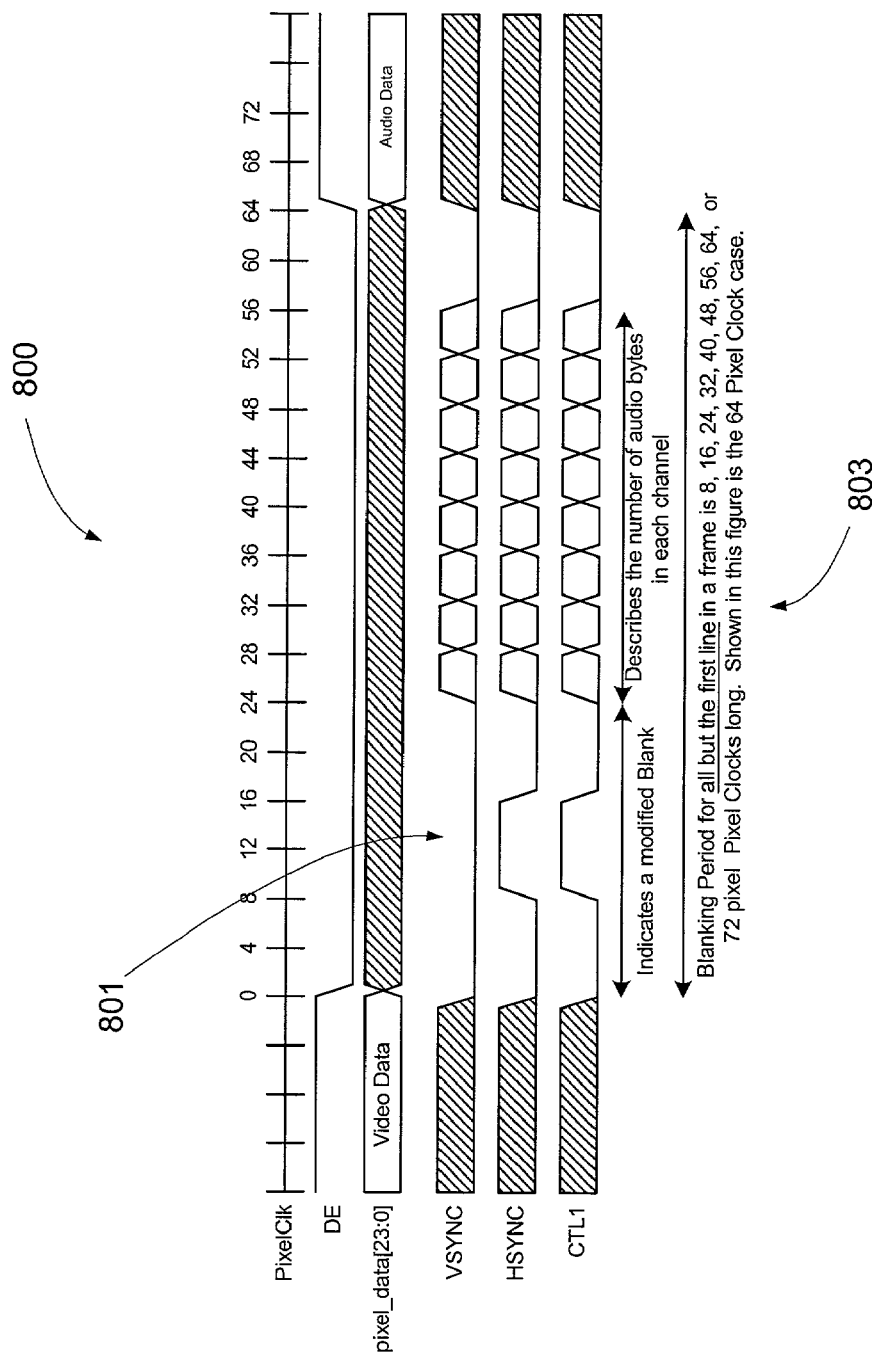
FIG. 8 illustrates a timing diagram of all lines but the first in the modified frame definition of FIG. 5.

To ensure accurate detection and timing for the sync pulses (and also to indicate CE type operation), a ctl1 signal is asserted at the same time the VSYNC and/or HSYNC sync pulses occur (see FIGS. 6 and 8, described below). The HSYNC pulse can be either positive or negative going. The HSYNC pulse, as reproduced by the receiver, has the same polarity as the transmitted HSYNC pulse. Similarly, the VSYNC pulse can be either positive or negative going. The VSYNC pulse, as reproduced by the receiver, likewise has the same polarity as the transmitted VSYNC pulse.

The CTL1 signal may have either a positive or negative going pulse. A positive going pulse may indicate, for example, that no error correction is being used for the audio data. A negative going pulse may indicate, for example, that the audio data has an error correction code being applied to it. The ability of a receiver to accept the audio error correction code may be verified by the transmitter prior to transmission, since the error correction capability is not a requirement of the DVI 1.0 standard.

In one embodiment, every line transmitted has an audio length descriptor transmitted during the blanking period. In other words, non-timing, low-bandwidth information (e.g., audio length) is being sent during the DE low period (i.e., blanking period). This has the advantage of not reducing the available audio bandwidth. The audio length descriptor may be, for example, 32 pixel clocks in duration and specifies the number of audio "pixels" in each audio channel for each line transmitted. In one embodiment, all audio channels operate at the same clock rate. In addition, all active audio channels have the same number of audio "pixels" transmitted on a given line, but the number of pixels may vary line to line. Because of this, only one descriptor per line is needed in this embodiment.

Due to the sensitivity of DVI to errors in the audio length descriptor data, this descriptor may be highly redundant. The descriptor may be 8 bits in length, for example. Each bit may be transmitted 4 times in succession, making for a total descriptor length of 32 bits. Three copies of the descriptor may be transmitted simultaneously: one on the HSYNC line, one on the VSYNC line, and one on the ctl3 line. In case of errors, the receiver can determine, based upon a majority vote, the correct audio length descriptor data. Of course, other redundancy schemes may be used and are within the scope of the present invention.

Figure 6:
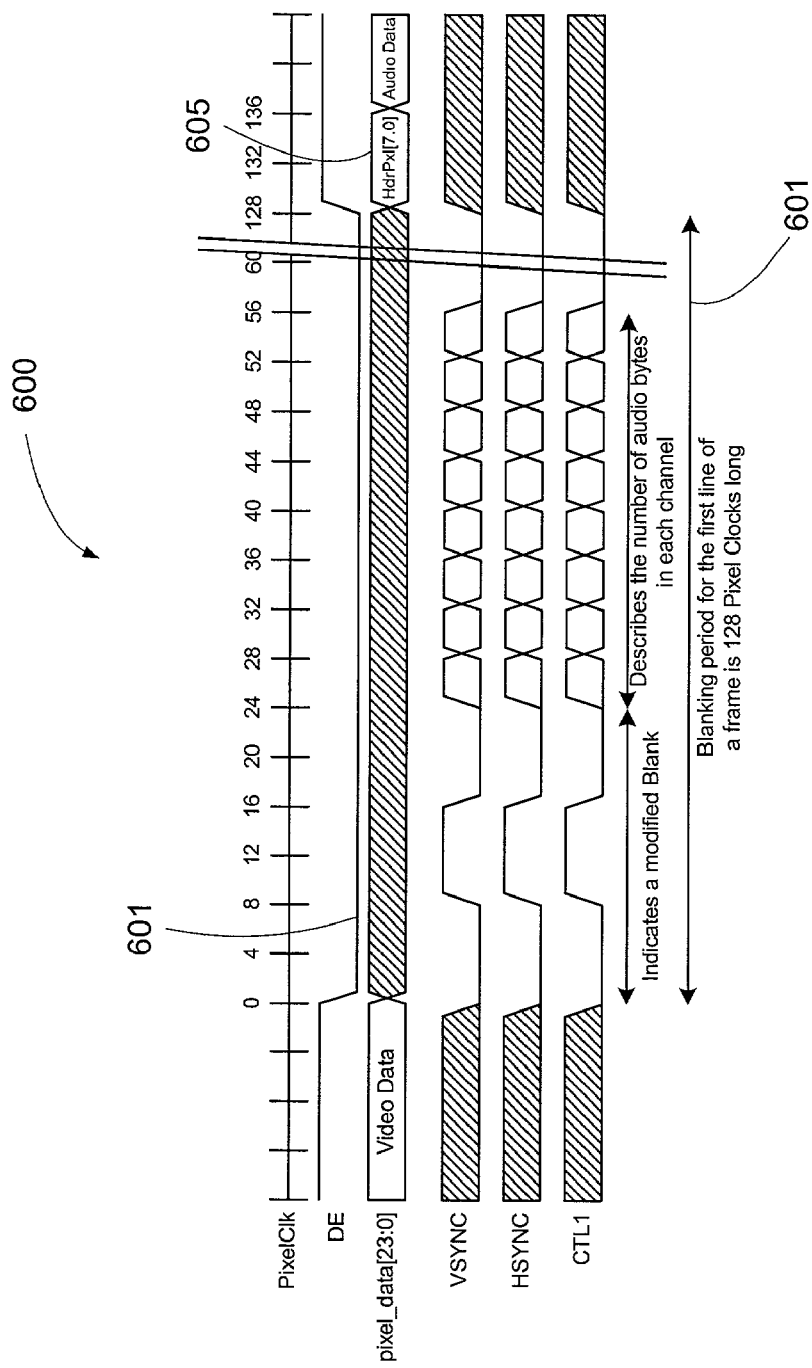
FIG. 6 illustrates a timing diagram of the first line in the modified frame definition of FIG. 5.

FIG. 6 illustrates a timing diagram 600 of the first line in the modified frame definition of FIG. 5. This first line represents a modified VSYNC pulse. The line begins with a blanking period 601, as described above. As can be seen in FIG. 6, the blanking period 601 occurs while DE 603 is low. In this embodiment, the total blanking time for blanking period 601 is 128 pixel clock cycles long. Following the blanking period 601 is a frame definition field 605 (HdrPxl [7:0]). This field is transmitted over the eight pixel clock cycles following the blanking period 601. All parameters needed to reconstruct a standard video frame at the receiver are defined in the data packet of frame definition field 605.

Figure 7:
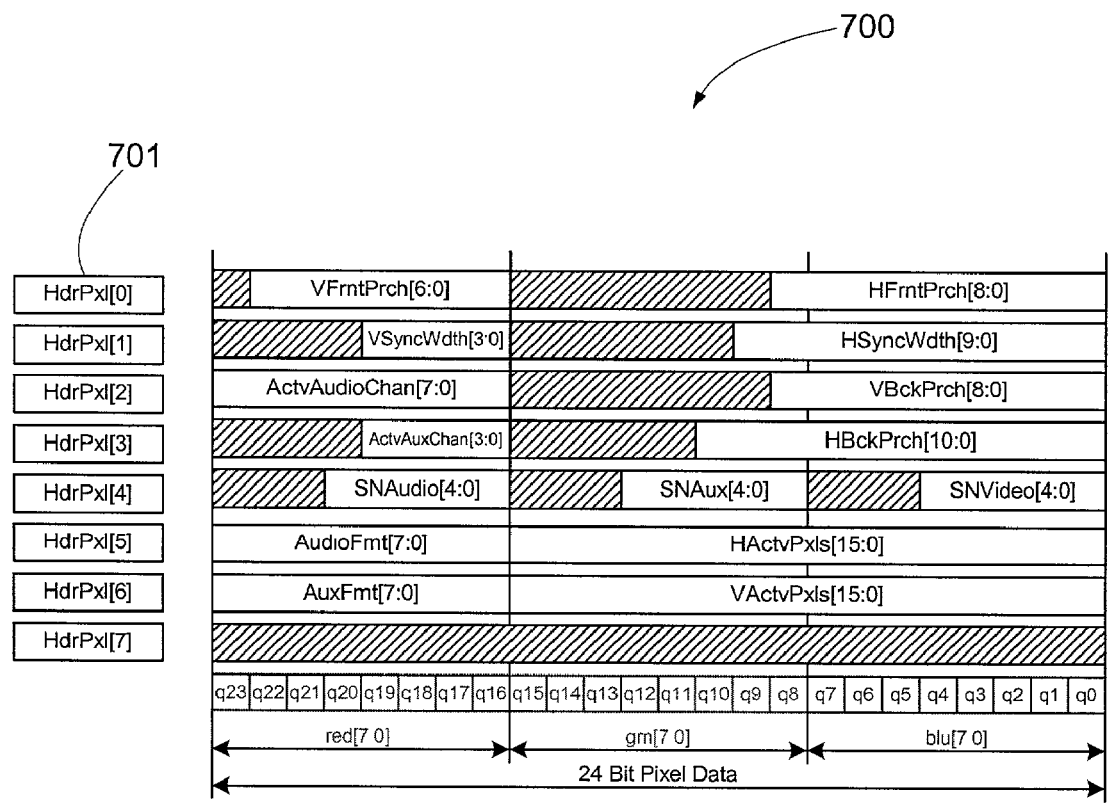
FIG. 7 illustrates one embodiment of a frame definition packet format in accordance with the present invention.

One possible location of the various parameters in the frame definition packet is illustrated in FIG. 7. HdrPxl[0] is the first 24 bit pixel transmitted after the blanking period 601 of FIG. 6 ends. The frame definition packet 700 of FIG. 7 is 8 pixel clock cycles long and contains all information necessary to: (1) define the VSYNC pulse to be regenerated at the receiver, (2) define the HSYNC pulse to be regenerated at the receiver, and (3) temporally align the audio, video, and auxiliary data. All signals shown in FIG. 7 are defined, according to one embodiment, in Table 1 below.

TABLE 1

| Signal | Description |
| --- | --- |
| HFrntPrch[8:0] | Horizontal Sync Front Porch. Specifies the number of pixel clock cycles into the blanking period that the horizontal sync will start. Used to generate the HSYNC pulse at the receiver. On the transmitter, this value is set via the configuration registers or via automatic detection. |

TABLE 1-continued

| Signal | Description |
|---|---|
| HsyncWdth[9:0] | Horizontal Sync Pulse Width. Specifies the duration of the horizontal sync in pixels. Used to generate the HSYNC pulse at the receiver. On the transmitter, this value is set via the configuration registers or via automatic detection. |
| HBckPrch[10:0] | Horizontal Sync Back Porch. Specifies the number of pixel clock cycles following the horizontal sync pulse that the blanking period will end. Used to generate the HSYNC at the receiver. On the transmitter, this value is set via the configuration registers or via automatic detection. |
| VFrntPrch[6:0] | Vertical Sync Front Porch. Specifies the number of lines into the vertical blanking period that the vertical sync will start. Used to generate the VSYNC pulse at the receiver. On the transmitter, this value is set via the configuration registers or via automatic detection. |
| VsyncWdth[3:0] | Vertical Sync Pulse Width. Specifies the duration of the vertical sync in lines. Used to generate the VSYNC pulse at the receiver. On the transmitter, this value is set via the configuration registers or via automatic detection. |
| VBckPrch[8:0] | Vertical Sync Back Porch. Specifies the number of lines following the vertical sync pulse that the blanking period will end. Used to generate the VSYNC at the receiver. On the transmitter, this value is set via the configuration registers or via automatic detection. |
| HactvPxls[15:0] | The number of horizontal addressable pixels in the output screen. Note that this number includes the borders if left/right borders exist. |
| VactvPxls[15:0] | The number of vertical addressable lines in the output screen. Note that this number include the borders if top/bottom borders exist. |
| AudioFmt[7:0] | This field is used to convey the audio format being transmitted.<br>0 → Raw, parallel 24 bit data<br>1 → S/PDIF<br>2 → DVD Audio<br>etc. |
| AuxFmt[7:0] | This field is used to convey the auxiliary format being transmitted.<br>0 → Raw, parallel 24 bit data<br>1 → closed captioning<br>etc. |
| SNVideo[4:0] | This number is used to align the received video data with the corresponding audio and auxiliary data |
| SNAudio[4:0] | This number is used to align the received audio data with the corresponding video and auxiliary data |
| SNAux[4:0] | This number is used to align the received auxiliary data with the corresponding audio and video data |

The variables that define the frame metrics (HFrntPrcn, HsyncWidth, HBckPrch, VFrntPrcn, VsyncWidth, VBckPrch, HactvPxis and VactvPxls) generally do not change regularly. These values may therefore be observed over at least 2 frames to ensure that any changes are not the result of bit errors over the communications link.

As mentioned above, FIG. 6 illustrates a timing diagram of the first line 501 in the modified frame definition of FIG. 5. Every other line of FIG. 5 takes the form shown in FIG. 8. In other words, FIG. 8 illustrates a timing diagram 800 of these lines, and represents a modified HSYNC. There are generally three differences between the timing diagrams of FIG. 8 and FIG. 6. First, VSYNC does not transition during the modified blanking period in FIG. 8 (see generally reference numeral 801). Second, there is no frame definition packet in FIG. 8. Finally, the back porch of the blanking period may be either 48 or 112 pixel clocks long creating a blanking period 803 that is of 8, 16, 24, 32, 40, 48, 56, 64, or 72 pixel clocks long. This is different from the 128 pixel clock blanking period of the first line. This allows for more efficient usage of the total available bandwidth.

The 48 pixel clock back porch, for example, is an optional mode that is not required. It is made available for applications involving more than 2 channels of audio data as in 5.1 or 7.1. The transmit hardware queries the receiver via a DDC channel to ascertain if the receiver is capable of receiving shorter blanking periods.

Figure 9A:
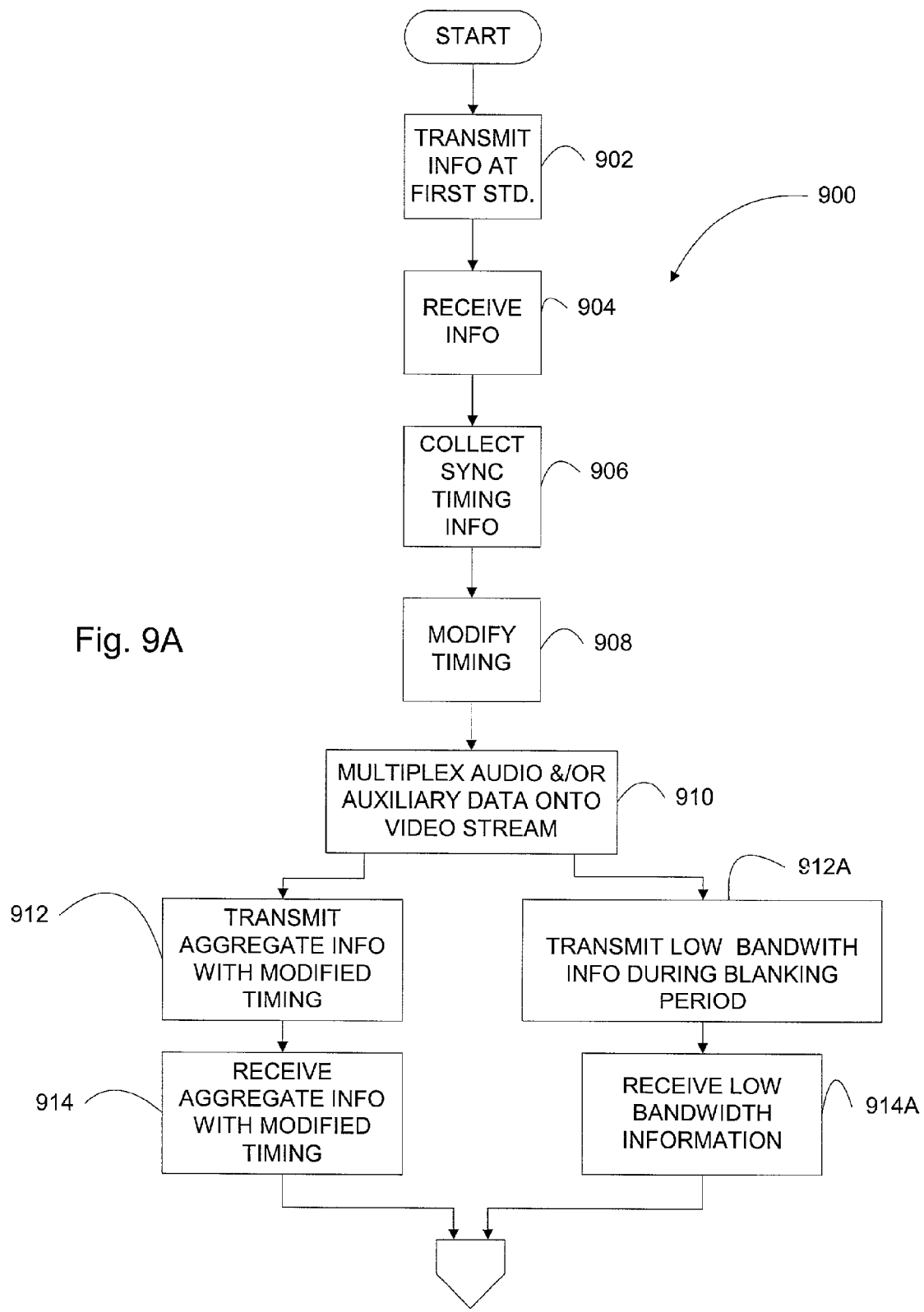
FIGS. 9A and 9B illustrate a flow diagram of one method of increasing digital data capacity in accordance with one embodiment of the present invention.
Figure 9B:
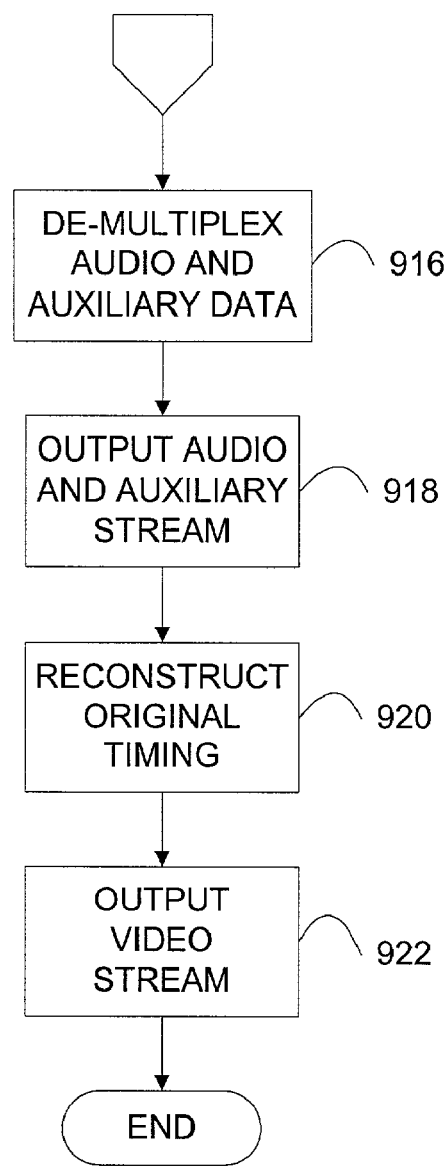

FIGS. 9A and 9B provide an overview of one method of increasing digital data capacity in accordance with one embodiment of the present invention. In one example, the illustrated method may be used to increase the digital data capacity of a digital video communications link wherein the data on the link is encrypted according to the HDCP standard.

The illustrated method 900 starts, transmitting information at a first timing standard as illustrated by block 902. The transmitted information is received as illustrated by block 904, sync timing information about the received information is collected as illustrated by block 906 and the collected timing information is modified as illustrated by block 908. Audio and/or auxiliary data are multiplexed along with video data onto a video stream, forming aggregate information, and transmitted with the modified timing as illustrated by blocks 910 and 912 respectively.

In addition to transmitting the aggregate information and modified timing information, non-timing, low bandwidth information is transmitted during the blanking periods as illustrated by block 912A. This low bandwidth information may be, for example, close captioning information, other auxiliary data information, or even audio. The aggregate information, with the modified sync timing, is received as illustrated by block 914 and demultiplexed as illustrated by block 916. Demultiplexing the aggregate information reconstructs or regenerates the audio and auxiliary data. The audio and auxiliary data is output as an audio and auxiliary stream as illustrated by block 918. The first timing standard is reconstructed and a video stream is output at the first timing standard as illustrated by blocks 920 and 922, respectively.

Figure 10A:
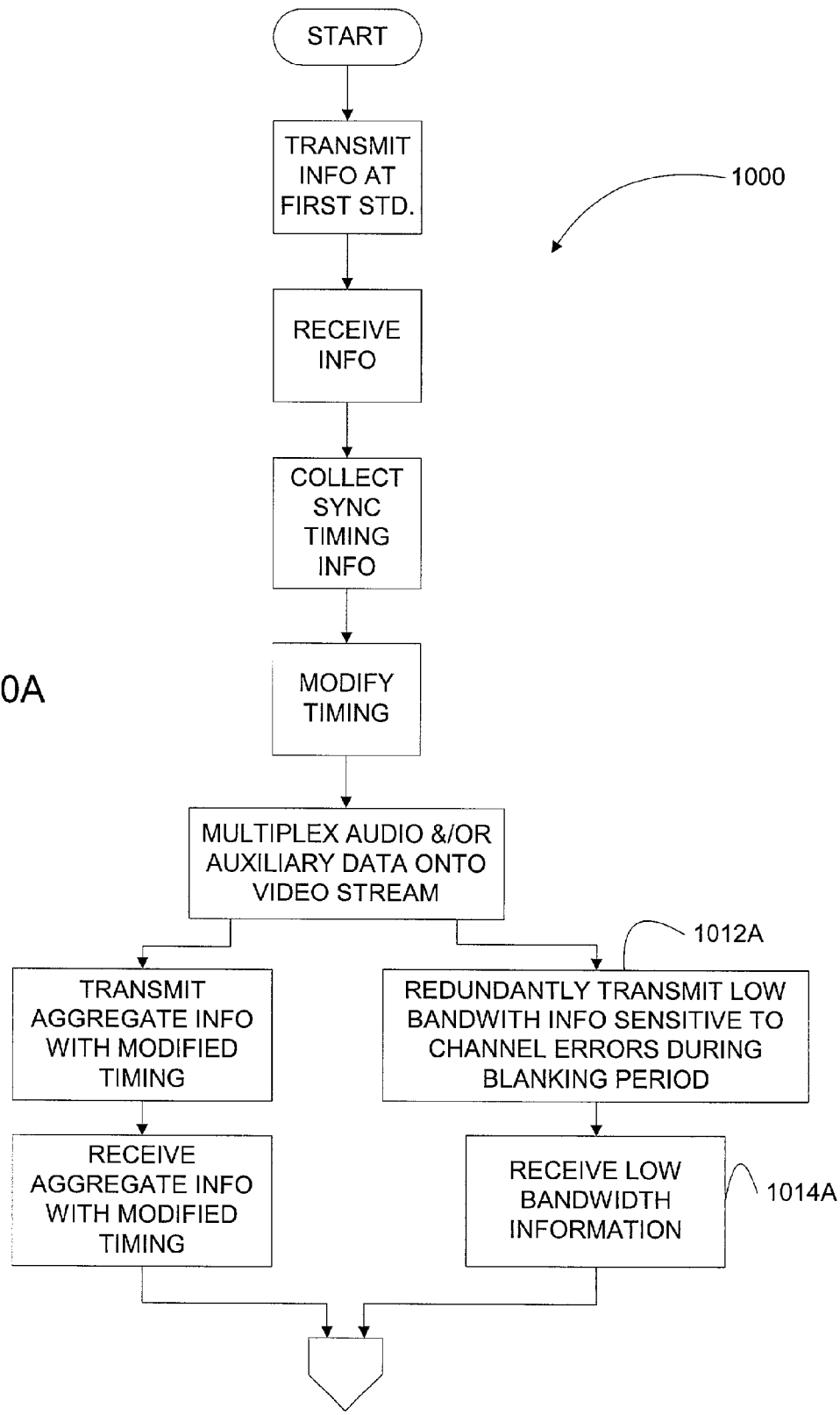
FIGS. 10A and 10B provide an overview of an alternate method of increasing digital data capacity in accordance with one embodiment of the present invention similar to that illustrated in FIGS. 9A and 9B, which utilizes redundant transmission of low bandwidth information.
Figure 10B:
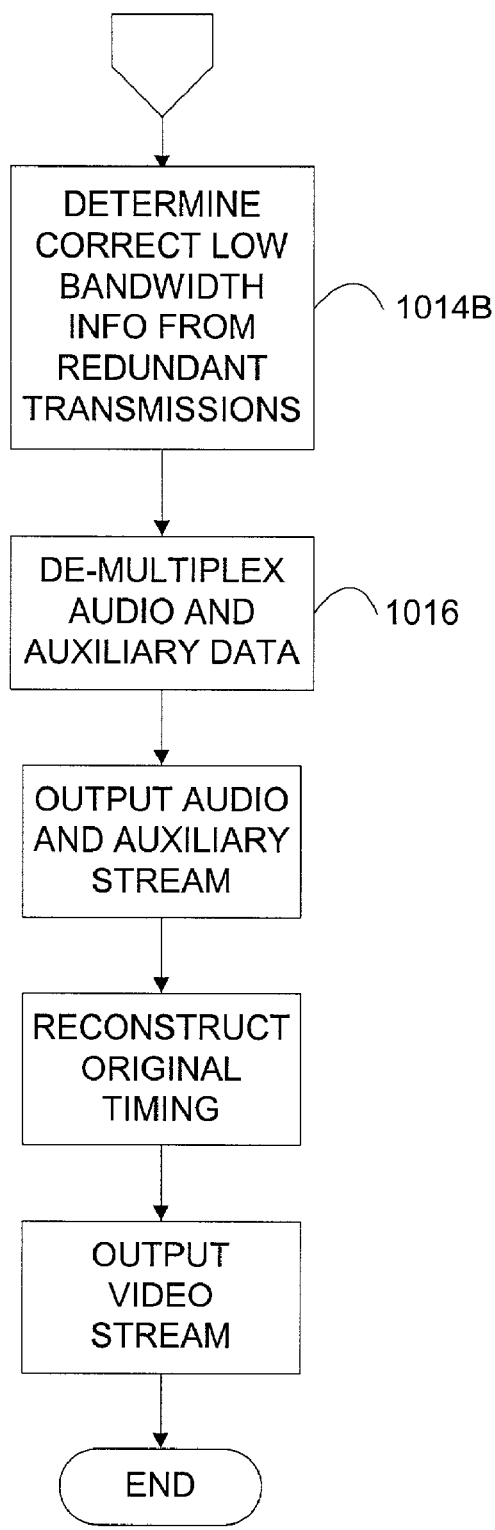

FIGS. 10A and 10B provide an overview of an alternate method of increasing digital data capacity in accordance with one embodiment of the present invention similar to that illustrated in FIGS. 9A and 9B. Again, the illustrated method may be used to increase the digital data capacity of a digital video communications link wherein the data on the link is encrypted according to the HDCP standard.

Illustrated method 1000 proceeds like the method 900 of FIGS. 9A and 9B, except that block 1012A of FIG. 10A is different than block 912A of FIG. 9A, and new block 1014B is added in FIG. 10B. Specifically, in block 1012A of FIG. 10A, the low bandwidth information is transmitted redundantly. This is done, for example, in cases where the low bandwidth information being sent is sensitive to channel errors. For example, in an embodiment where audio length information is transmitted during the blanking period, redundancy may be used (as discussed above). Once the audio length information is received (block 1014A) and the correct audio length data determined (block 1014B), the audio length information is used at block 1016 to pull the audio data from the aggregate information.

Figure 11:
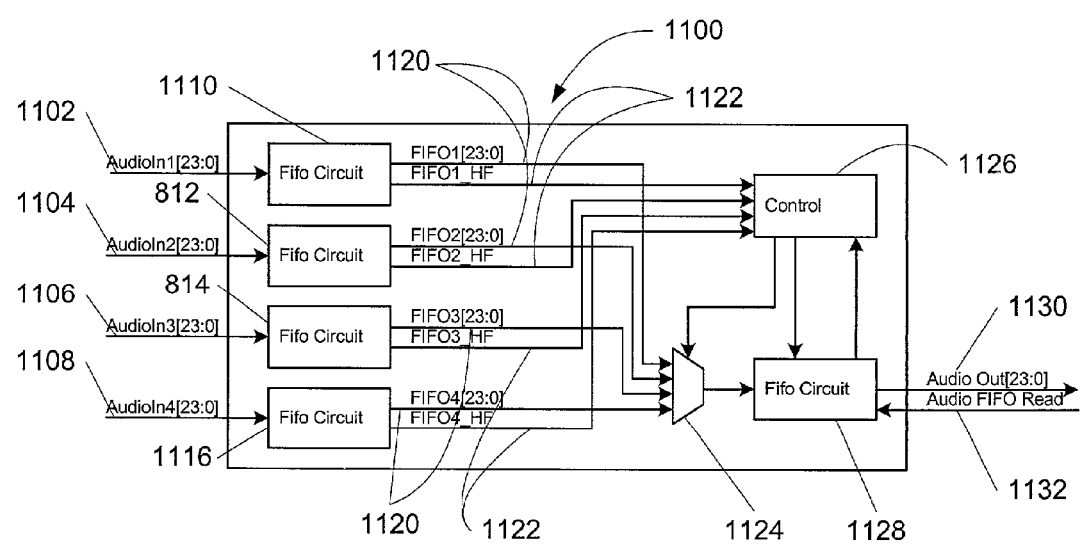
FIG. 11 illustrates a block diagram of one embodiment of a FIFO buffer circuit used for assembling the audio streams into a single stream for transmission in the horizontal blanking periods in accordance with one embodiment of the present invention.

FIG. 11 is a block diagram of one embodiment of a FIFO buffer circuit 1100 used in one embodiment for assembling the audio streams into a single stream for transmission in the horizontal blanking periods. In this embodiment, four channels of 24 bit digital audio date are assembled into a single stream. Four audio inputs, AudioIn1 1102, AudioIn2 1104, AudioIn3 1106, and AudioIn4 1108 are illustrated as inputs to FIFO circuits 1110, 1112, 1114 and 1116, respectively. Each of the FIFO circuits has two outputs, FIFO1 1120 and FIFO1_HF 1122. For example, FIFO Circuit 1110 has FIFO1 and FIFO1_HF outputs 1120 and 1122, while FIFO circuit 1116 has FIFO4 and FIFO4_HF outputs 1120 and 1122 as illustrated. Each of the FIFO outputs 1120 are communicated to a multiplexer 1124 while each of the FIFO_HF outputs 1122 are communicated to a control 1126 communicating with the FIFO circuit 1128 and multiplexer 1124. FIFO circuit 1128 receives an output of the multiplexer 1124 as its input. Audio FIFO Read 1132 is communicated to the FIFO Circuit 1128 and Auxiliary Out 1130 is output to the Data Stream Multiplexer illustrated in FIG. 13.

In this embodiment, each audio link supports data at rates of at least 3.1 Mbps. It is contemplated this rate may be exceeded, however the throughput of all combined channels generally does not exceed the maximum available audio bandwidth.

Figure 12:
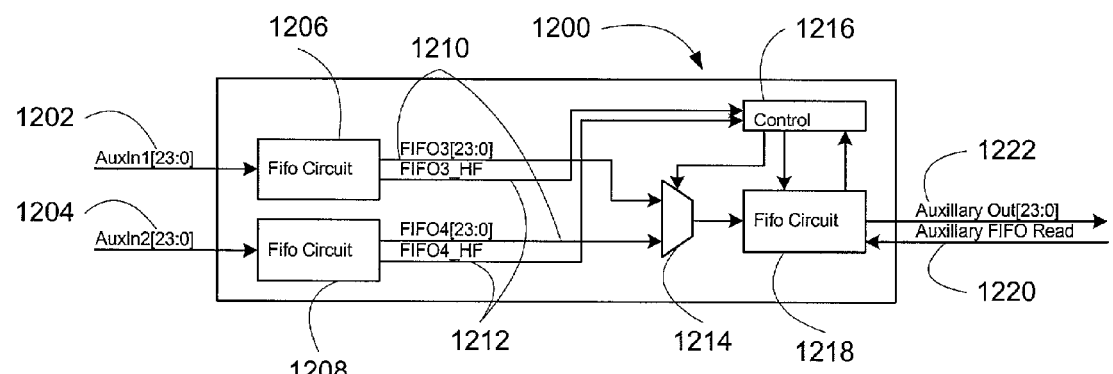
FIG. 12 illustrates a block diagram of one embodiment of a FIFO buffer circuit used for assembling the auxiliary streams into a single stream for transmission in the vertical blanking period in accordance with one embodiment of the present invention.

FIG. 12 illustrates a block diagram of one embodiment of a FIFO buffer circuit 1200 used to assemble the auxiliary streams into a single stream for transmission in the vertical blanking period. In one embodiment, two channels of 24 bit auxiliary data AuxIn1 1202 and AuxIn2 1204 are illustrated being assembled into a single stream. The FIFO buffer circuit 1200 includes two FIFO circuits 1206 and 1208 having AuxIn1 1202 and AuxIn2 1204 as inputs. Of course, any number of audio or auxiliary channels may be used.

Each of the FIFO circuits has two outputs, FIFO 1210 and FIFO_HF 1212. For example, FIFO Circuit 1206 has a FIFO3 and FIFO3_HF outputs 1210 and 1212, while FIFO circuit 1208 has a FIFO4 and FIFO4_HF outputs 1210 and 1212 as illustrated. Each of the FIFO outputs 1210 are communicated to a multiplexer 1214 while each of the FIFO_HF outputs 1212 are communicated to a control 1216 communicating with a third FIFO circuit 1218. FIFO circuit 1218 receives an output from the multiplexer 1214 as an input. Auxiliary FIFO Read 1220 is communicated to the FIFO Circuit 1218 and Auxiliary Out 1222 is output to the Data Stream Multiplexer illustrated in FIG. 13. It should be appreciated that, in one embodiment, the throughput of the combined auxiliary channels does not exceed the maximum available auxiliary bandwidth. In addition, the auxiliary bandwidth may be defined as the traditional vsync blanking period less the hsync portion of this blanking period.

Figure 13:
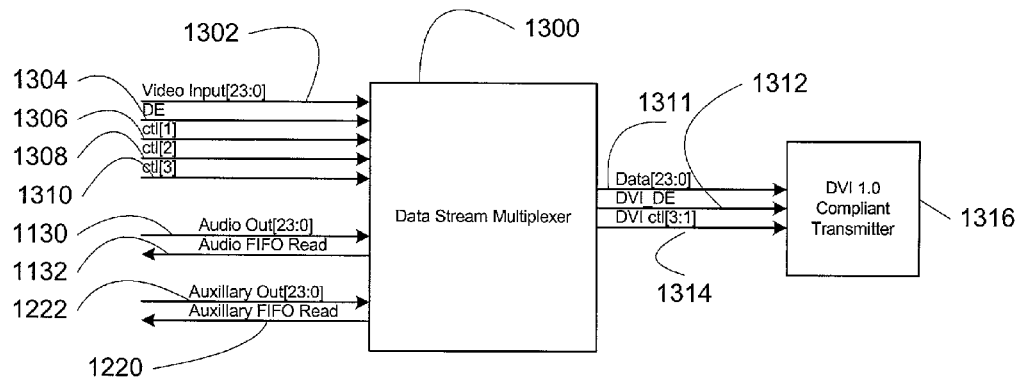
FIG. 13 illustrates a block diagram of one embodiment of a data stream multiplexer for multiplexing the digital audio, auxiliary digital data and digital video streams into a single digital stream for transmission across a DVI 1.0 in accordance with one embodiment of the present invention.

FIG. 13 illustrates a block diagram of one embodiment of a data stream multiplexer, generally designated 1300, for multiplexing the digital audio, auxiliary digital data and digital video streams into a single digital stream for transmission across a DVI link. In this embodiment, the multiplexer multiplexes a video input 1302, DE 1304, ctl[1] 1306, ctl[2] 1308 and ctl[3] 1310. In addition, the audio out 1130 and auxiliary out 1222 are input and the Audio FIFO Read 1132 and Auxiliary FIFO Read 1220 are communicated to the FIFO buffer circuits 1100 and 1200 respectively as illustrated. The Data Stream Multiplexer 1300 outputs data 1311, DVI_DE 1312 and DVI ctl 1314 to a DVI compliant transmitter 1316. The DVI compliant transmitter in turn transmits this data to the receiving side illustrated in FIGS. 14, 15 and 16.

Figure 14:
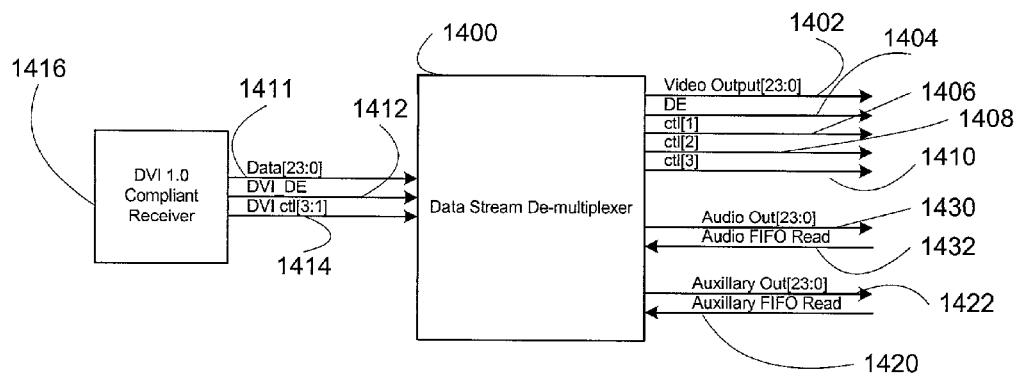
FIG. 14 illustrates a block diagram of a data stream demultiplexer for demultiplexing the single digital stream into the digital audio, auxiliary digital data and digital video streams in accordance with one embodiment of the present invention.

FIG. 14 illustrates a block diagram of one embodiment of a data stream demultiplexer, generally designated 1400 for demultiplexing the single digital stream into the digital audio, auxiliary digital data and digital video streams. This device performs the inverse functions of the multiplexer illustrated in FIG. 13.

A DVI compliant receiver 1416 receives or acquires the data transmitted by the DVI compliant transmitter 1316. In this embodiment, the receiver 1416 outputs data 1410, DVI_DE 1412 and DVI ctl 1414 to the Data Stream Demultiplexer 1400. The Data Stream Demultiplexer 1400 demultiplexes or separates such data into video output 1402, DE 1404, ctl[1] 1406, ctl[2] 1408 and ctl[3] 1410. In addition, the Data stream demultiplexer 1400 outputs Audio Out 1430 and Auxiliary Out 1422. Audio FIFO Read 1432 and Auxiliary FIFO Read 1420 are communicated to and from the FIFO buffer circuits illustrated in FIGS. 15 and 15. It should be appreciated that, in one embodiment, Audio Out 1430, Auxiliary Out 1422, Audio FIFO Read 1432 and Auxiliary FIFO Read 1420 are substantially similar to, if not the same as, Audio Out 1130, Auxiliary Out 1222, Audio FIFO Read 1132 and Auxiliary FIFO Read 1220 discussed previously.

Figure 15:
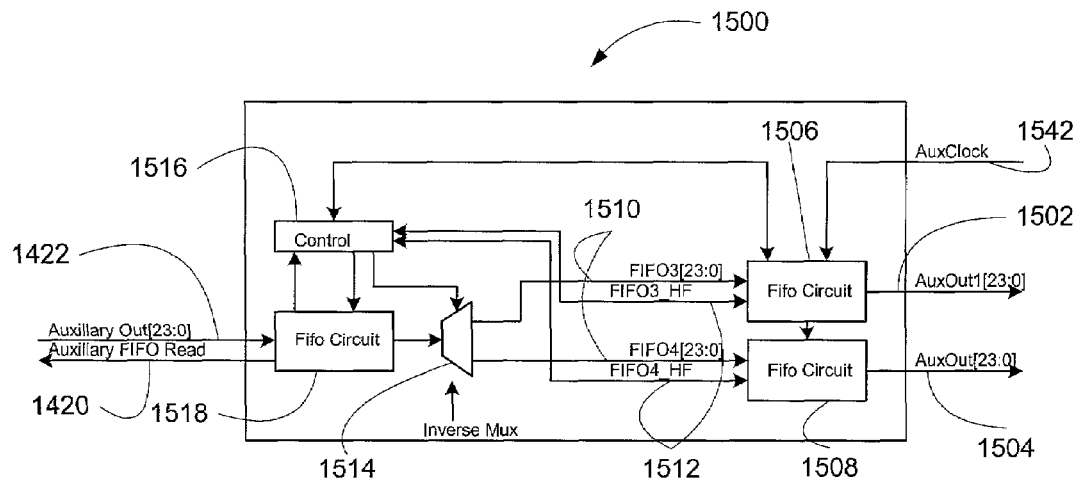
FIG. 15 illustrates a block diagram of a FIFO buffer circuit used for separating the single composite auxiliary data channel into its constituent data streams in accordance with one embodiment of the present invention.

FIG. 15 illustrates a block diagram of a FIFO buffer circuit, generally designated 1500, used for separating the single composite auxiliary data channel into its constituent data streams. In one embodiment, this circuit performs the inverse function of the circuit illustrated in FIG. 12. In the illustrated embodiment, Auxiliary Out 1422 is separated into two channels of 24 bit auxiliary data AuxOut1 1502 and AuxOut 1504. The FIFO buffer circuit 1500 includes a FIFO circuit 1518 that receives Auxiliary Out 1422 as an input and outputs Auxiliary FIFO Read 1420.

The FIFO Circuit 1518 communicates with an inverse multiplexer 1514 and a control 1516 that in turn communicates with the inverse multiplexer 1514. The control 1516 communicates with two FIFO Circuits 1506 and 1504 and a clock recovery device, outputting an AUXClock signal 1542. Of course, several clock recovery PLL's may be used to support multiple auxiliary and audio data rates Each of the FIFO circuits 1506 and 1508 has two inputs, FIFO 1510 and FIFO HF 1512, where FIFO 1510 is communicated by the inverse multiplexer 1514 and FIF_HF is communicated by the control 1516. For example, FIFO Circuit 1506 has a FIFO3 and FIFO3_HF inputs 1510 and 1512, while FIFO circuit 1508 has a FIFO4 and FIFO4_HF inputs 1510 and 1512 as illustrated. Each of the FIFO circuits has one output, where FIFO circuit 1506 outputs AuxOut1 1502 while FIFO Circuit 1508 outputs Auxout 1504 as illustrated.

Figure 16:
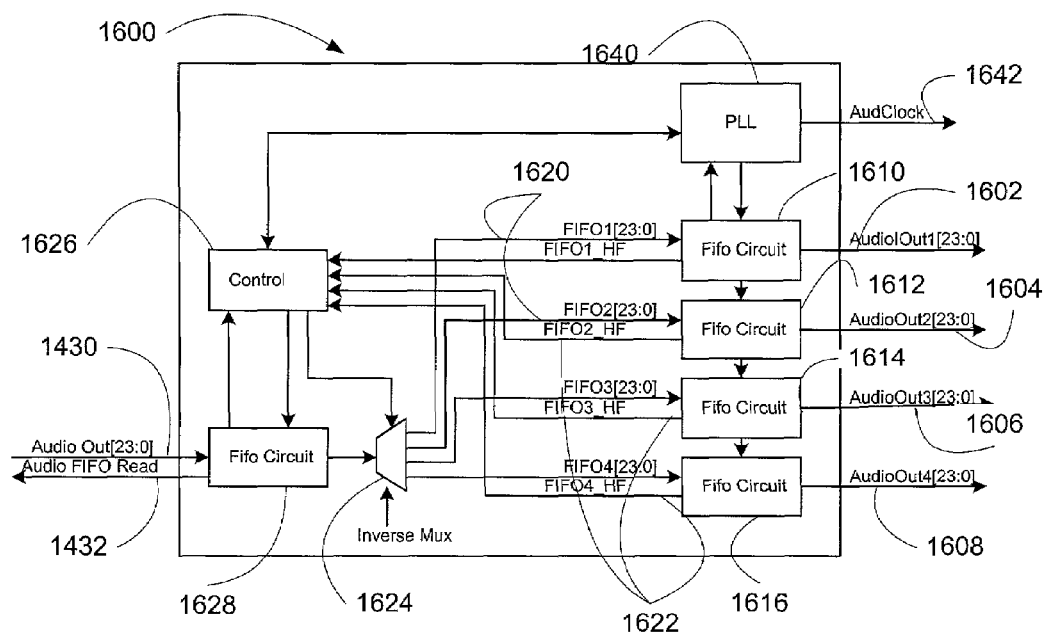
FIG. 16 illustrates a block diagram of a FIFO buffer circuit used for separating the single composite audio data channel into its constituent data streams in accordance with one embodiment of the present invention.

FIG. 16 is a block diagram of a FIFO buffer circuit 1600 used for separating the single composite audio data channel into its constituent data streams. This in the inverse function of the system illustrated in FIG. 11. In the illustrated embodiment, AudioOut 1430 is separated into AudioOut1 1602, AudioOut2 1604, AudioOut3 1606 and AudioOut4 1608. The FIFO buffer circuit 1600 includes a FIFO circuit 1628 that receives AudioOut 1430 as an input and outputs Audio FIFO Read 1432.

The FIFO Circuit 1628 communicates with a inverse multiplexer 1624 and a control 1626 which outputs a signal to an inverse multiplexer 1624. The control 1626 communicates with four FIFO Circuits 1610, 1612, 1614 and 1616 and PLL 1640 outputting an AudioClock signal 1642. In addition, the FIFO circuit communicates with the inverse multiplexer 1624.

As illustrated, control 1626 communicates with the FIFO circuits using FIFO_HF 1622 signals as illustrated. In addition, the inverse multiplexer 1624 communicates with each of the FIFO circuits using FIFO signals 1620, and the FIFO circuits communicate with each other as illustrated.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A processing system for increasing digital data capacity of a digital video communications link, comprising:
    at least one assembly device adapted to assemble a plurality of digital data streams into a single digital data stream;
    a multiplexer adapted to multiplex the single digital data stream with a line of video data forming an aggregate digital data stream; and
    at least one transmitter adapted to transmit said aggregate digital data stream and low bandwidth information on a single link, said low bandwidth information being transmitted during blanking periods associated with the aggregate digital data stream.

2. The system of claim 1, wherein said transmitter transmits redundant low bandwidth information.

3. The system of claim 1 wherein said digital data stream comprises a digital audio data stream.

4. The system of claim 1 where said at least one assembly device comprises a FIFO circuit.

5. The system of claim 1 further comprising a receiver adapted to receive said aggregate digital data stream and said low bandwidth information.

6. The system of claim 1 further comprising a de-multiplexer adapted to demultiplex said aggregate digital data stream.

7. The system of claim 1 wherein said low bandwidth information comprises non-timing information.

8. The system of claim 7 wherein the digital data stream comprises a digital audio data stream and the low bandwidth information comprises audio length information.

9. A system for increasing a digital data capacity of a digital video communications link, said system comprising:
    means for accepting video data and audio data and combining said video data and audio data into aggregate data that is compatible with a predetermined video timing standard; and
    means for transmitting said aggregate data and low bandwidth information, on a single link.

10. The system of claim 9 wherein said low bandwidth information is transmitted during at least one blanking period of said aggregate data.

11. The system of claim 9 wherein said low bandwidth information comprises non-timing information.

12. The system of claim 11 wherein the low bandwidth information comprises audio length information.

13. The system of claim 12 further comprising means for splitting said aggregate data into said video data and said audio data using said low bandwidth information.

14. The system of claim 9 further comprising means for splitting said aggregate data into said video data and said audio data.

15. The system of claim 9 wherein said means for transmitting said low bandwidth information comprises means for transmitting redundant low bandwidth information.

16. A method for increasing the digital data capacity of a digital video communications link, comprising:
    decreasing the duration of a blanking interval associated with a line of video data to a duration less than industry standard blanking intervals;
    combining a digital data stream with a line of video data; and
    transmitting said digital data stream and low bandwidth information on a single link.

17. The method of claim 16 wherein the digital data stream comprises an audio data stream.

18. The method of claim 17 wherein said low bandwidth information comprises audio length information.

19. The method of claim 16 wherein said low bandwidth information comprises non-timing information.

20. The method of claim 16 wherein said transmitting occurs using bandwidth free by said decreasing.

21. The method of claim 16, including transmitting redundant low bandwidth information.

* * * * *

UNITED STATES PATENT AND TRADEMARK OFFICE
CERTIFICATE OF CORRECTION

PATENT NO. : 7,356,051 B2
APPLICATION NO. : 09/951671
DATED : April 8, 2008
INVENTOR(S) : Pasqualino et al.

It is certified that error appears in the above-identified patent and that said Letters Patent is hereby corrected as shown below:

Title Page of Patent, in the Title: Item [54], and in Col. 1, lines 3 and 4, after "...and Auxiliary Data" delete "Cross Reference to Related Applications"

Signed and Sealed this

Twenty-fourth Day of June, 2008

JON W. DUDAS
*Director of the United States Patent and Trademark Office*